(12) United States Patent
Husher (10) Patent No.: US 7,541,235 B2
(45) Date of Patent: Jun. 2, 2009

(54) METHOD FOR PROVIDING A PROGRAMMABLE ELECTROSTATIC DISCHARGE (ESD) PROTECTION DEVICE

(75) Inventor: John D. Husher, Los Altos Hills, CA (US)

(73) Assignee: Micrel, Inc., San Jose, CA (US)

( * ) Notice: Subject to any disclaimer, the term of this patent is extended or adjusted under 35 U.S.C. 154(b) by 175 days.

(21) Appl. No.: 11/447,585

(22) Filed: Jun. 5, 2006

(65) Prior Publication Data

US 2006/0237794 A1    Oct. 26, 2006

Related U.S. Application Data

(62) Division of application No. 10/927,701, filed on Aug. 27, 2004, now Pat. No. 7,113,835.

(51) Int. Cl.
*H01L 21/8238* (2006.01)
(52) U.S. Cl. .................. 438/200; 257/355; 257/356; 257/357; 361/56
(58) Field of Classification Search .......... 257/355–358; 361/56; 438/200, 202
See application file for complete search history.

(56) References Cited

U.S. PATENT DOCUMENTS

| | | | |
|---|---|---|---|
| 4,928,155 A | 5/1990 | Nakagawa et al. | |
| 5,306,656 A | 4/1994 | Williams et al. | |
| 5,374,843 A | 12/1994 | Williams et al. | |
| 5,627,394 A * | 5/1997 | Chang et al. | 257/335 |
| 6,057,579 A | 5/2000 | Hsu et al. | |
| 6,069,396 A | 5/2000 | Funaki | |
| 6,462,382 B2 | 10/2002 | Yoshida et al. | |
| 6,483,149 B1 | 11/2002 | Mosher et al. | |
| 6,879,003 B1 * | 4/2005 | Cheng et al. | 257/355 |
| 6,927,453 B2 * | 8/2005 | Shibib et al. | 257/336 |
| 2002/0043687 A1 * | 4/2002 | Tsuji et al. | 257/355 |
| 2004/0075145 A1 | 4/2004 | Shibib | |
| 2004/0129983 A1 * | 7/2004 | Mallikarjunaswamy | 257/370 |
| 2004/0222461 A1 | 11/2004 | Peyre-Lavigne et al. | |
| 2004/0238913 A1 | 12/2004 | Kwon et al. | |
| 2005/0035424 A1 | 2/2005 | Beasom | |
| 2006/0186467 A1 * | 8/2006 | Pendharkar et al. | 257/337 |

OTHER PUBLICATIONS

Duvvury et al., "Lateral DMOS Design for ESD Robustness," Texas Instruments, IEDM 1997, IEEE, p. 375-378.*

* cited by examiner

*Primary Examiner*—Ha Tran T Nguyen
*Assistant Examiner*—Daniel Whalen
(74) *Attorney, Agent, or Firm*—Sawyer Law Group, P.C.

(57) ABSTRACT

A method for providing a programmable electrostatic discharge (ESD) protection device is provided. The method includes providing a source diffusion in a substrate, providing a deeper body diffusion in the substrate, providing a gate at a space between the source diffusion and the body diffusion, and providing a variable structure for shorting the source diffusion and the body diffusion to each other when ESD voltage is encountered on a circuit connected thereto, wherein the variable structure comprises a plurality of contacts over the source diffusion for the source diffusion to be grounded to the body diffusion.

10 Claims, 5 Drawing Sheets

Invention - Shows programmable contacts shorting source/body to ground

Typical hook up at input of ESD protection circuit

Standard lateral DMOS - showing metal shorting source/body to ground

Very short distance in standard lateral DMOS

Invention - Shows programmable contacts shorting source/body to ground

Typical snap back (sustaining) voltage & sustaining current of MOS, CMOS, and certain DMOS structures

FIG.4

METHOD FOR PROVIDING A PROGRAMMABLE ELECTROSTATIC DISCHARGE (ESD) PROTECTION DEVICE

CROSS-REFERENCE TO RELATED APPLICATIONS

This application is a divisional of U.S. application Ser. No. 10/927,701, filed on Aug. 27, 2004, now U.S. Pat. No. 7,113,835 which is hereby incorporated by reference in its entirety for all purposes as if fully set forth herein.

FIELD OF THE INVENTION

The present invention relates generally to integrated circuits and more particularly to a programmable electrostatic discharge protection approach for an integrated circuit.

BACKGROUND OF THE INVENTION

Many complex circuits are presently used for electrostatic discharge (ESD) protection. Many times the ESD circuit does not act rapidly enough to prevent damage. Designs change for different technologies, processes and within technologies and processes that result in inadequate ESD protection to be provided. In some cases, the protection circuit loads the input of the device and robs the input of part of the signal strength. Oftentimes there are resistance/voltage disparities that can be too high in most electrostatic discharge protection circuits causing them to lose protection on high voltage ESD spikes. In the other extreme, some protection circuits do not function well at low voltages. In general, each process and/or each technology requires a change in the ESD protection for the specific process to provide special protection for a given circuit function within that design and process.

Accordingly, what is needed is a system and method for providing ESD protection via a circuit that is easily implemented, compatible with all (or most) existing technologies, cost effective. The present invention addresses such a need.

SUMMARY OF THE INVENTION

An electrostatic discharge (ESD) protection device is disclosed. The ESD protection device comprises a source diffusion in a substrate and a deeper body diffusion in the substrate. The ESD protection device also includes a gate provided at a space over the dielectric bridging between the source diffusion and the body diffusion. In addition, the ESD protection device includes a drain located a predetermined distance from the body diffusion. Further, the ESD protection device includes a structure for shorting the source diffusion and the body diffusion to each other at programmable and variable locations to provide protection for determined ESD voltage ranges to be encountered.

A method for providing a programmable electrostatic discharge (ESD) protection device is also disclosed. The method includes providing a source diffusion in a substrate, providing a deeper body diffusion in the substrate, providing a gate at a space between the source diffusion and the body diffusion, and providing a variable structure for shorting the source diffusion and the body diffusion to each other when ESD voltage is encountered on a circuit connected thereto, wherein the variable structure comprises a plurality of contacts over the source diffusion for the source diffusion to be grounded to the body diffusion.

For convenience, the terminology used to describe the present invention is lateral double-diffused metal-oxide semiconductor (LDMOS) device terminology. However, in the application to be described it is not necessary to be processing a product that requires lateral DMOS technology. The functions described operate similar to lateral DMOS technology and can be provided in most, if not all, technologies, such as bipolar, complementary MOS (CMOS), bipolar CMOS (BiCMOS), DMOS, bipolar-CMOS-DMOS (BCD), and discrete, without using the lateral DMOS function.

Some of the advantages of the ESD protection device in accordance with the present invention include:

(1) The ESD protection device is simple and it does not interfere with the circuit it is protecting.
(2) The process steps required are available in most technologies without adding extra process steps.
(3) The ESD protection device in accordance with the present invention takes up less space.
(4) The level of initiation can be varied to fit the technology requirements, such as the voltage protection required, the power protection required, and the layout required.
(5) The ESD protection device is fast acting.
(6) The resistance is an inverse function of the ESD voltage, which makes it valuable for high or low voltage protection.
(7) The ESD protection device is programmable, which allows designers and process control personnel to easily design it in.

DETAILED DESCRIPTION

The present invention relates generally to integrated circuits and more particularly to electrostatic discharge (ESD) protection for an integrated circuit. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
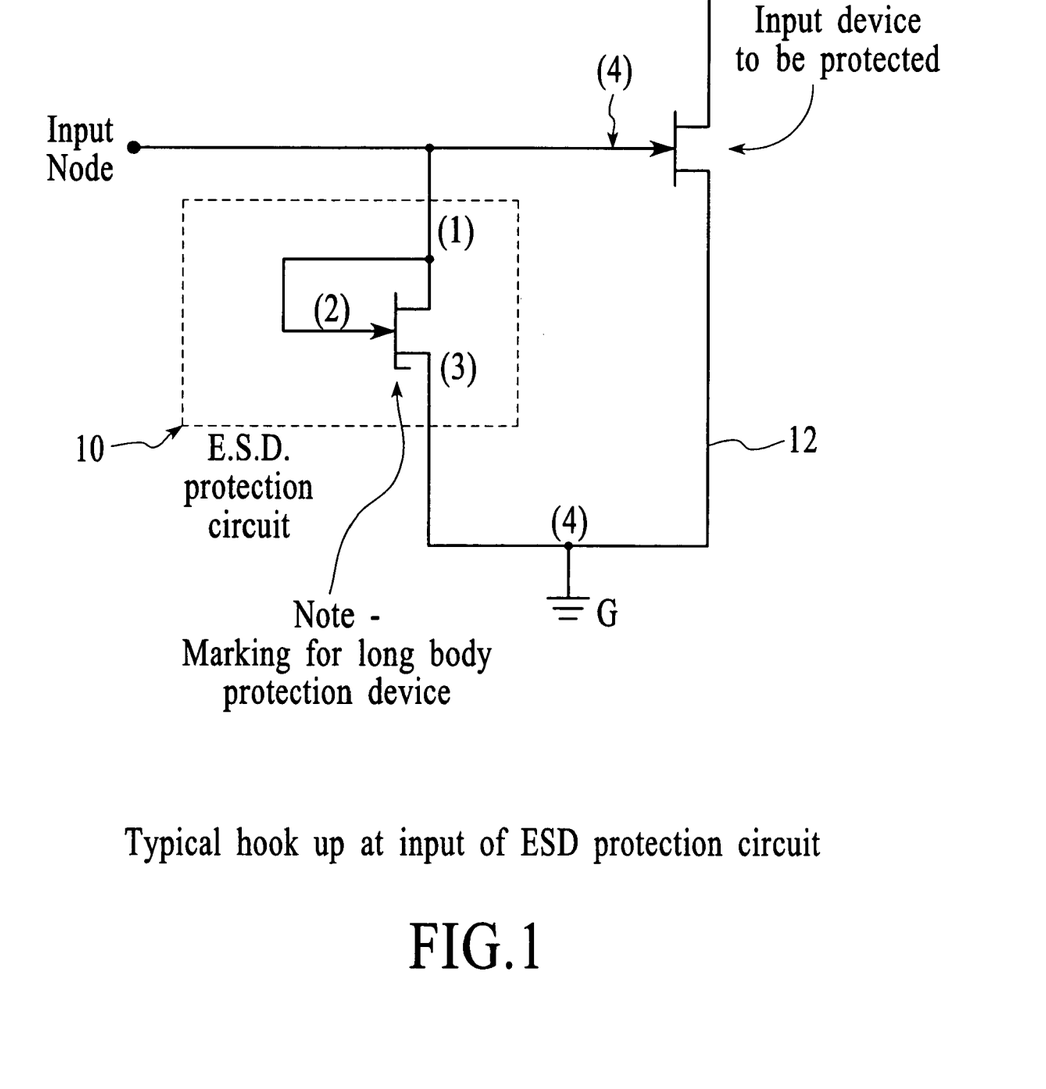
FIG. 1 is a diagram of a circuit that provides ESD protection according to an implementation of the present invention.

FIG. 1 is a circuit diagram illustrating electrostatic discharge (ESD) protection through the use of a special lateral double-diffused metal-oxide semiconductor (LDMOS) type structure in accordance with an implementation of the present invention. The ESD protection circuit 10 is displayed on one of the inputs of a metal-oxide field effect transistor (MOSFET) device 12. In this application, the ESD protection circuit 10 is protecting the MOSFET device 12 from being ruptured due to an ESD spike. The ESD protection circuit 10 could be on the inputs of almost any device for any technology. In the following paragraphs, the ESD protection circuit, which is also referred to as an ESD protection device, and its operation and integration into the integrated circuit of several technologies are described.

The structure of the ESD protection device in accordance with various embodiments of the present invention is quite simple, and the processes needed to form this structure are available in most integrated circuit technologies/processes. For these reasons, no extra steps or processes are needed to provide this protection. The ESD protection device is designed to operate similar to a lateral DMOS in a snap back (also referred to as sustaining voltage) condition when an ESD spike of various energies is exposed to the inputs of any integrated circuit. FIG. 1 shows a hook up of this protection circuit at an input and tied to a gate structure in accordance with an implementation of the present invention. Note that the schematic for the device shows a different marking than normal. It has an elongated tail on the diagram of the device denoting an extended gate to source distance. The reason for this unique diagram will be obvious as the structure of the device is described.

Figure 2:
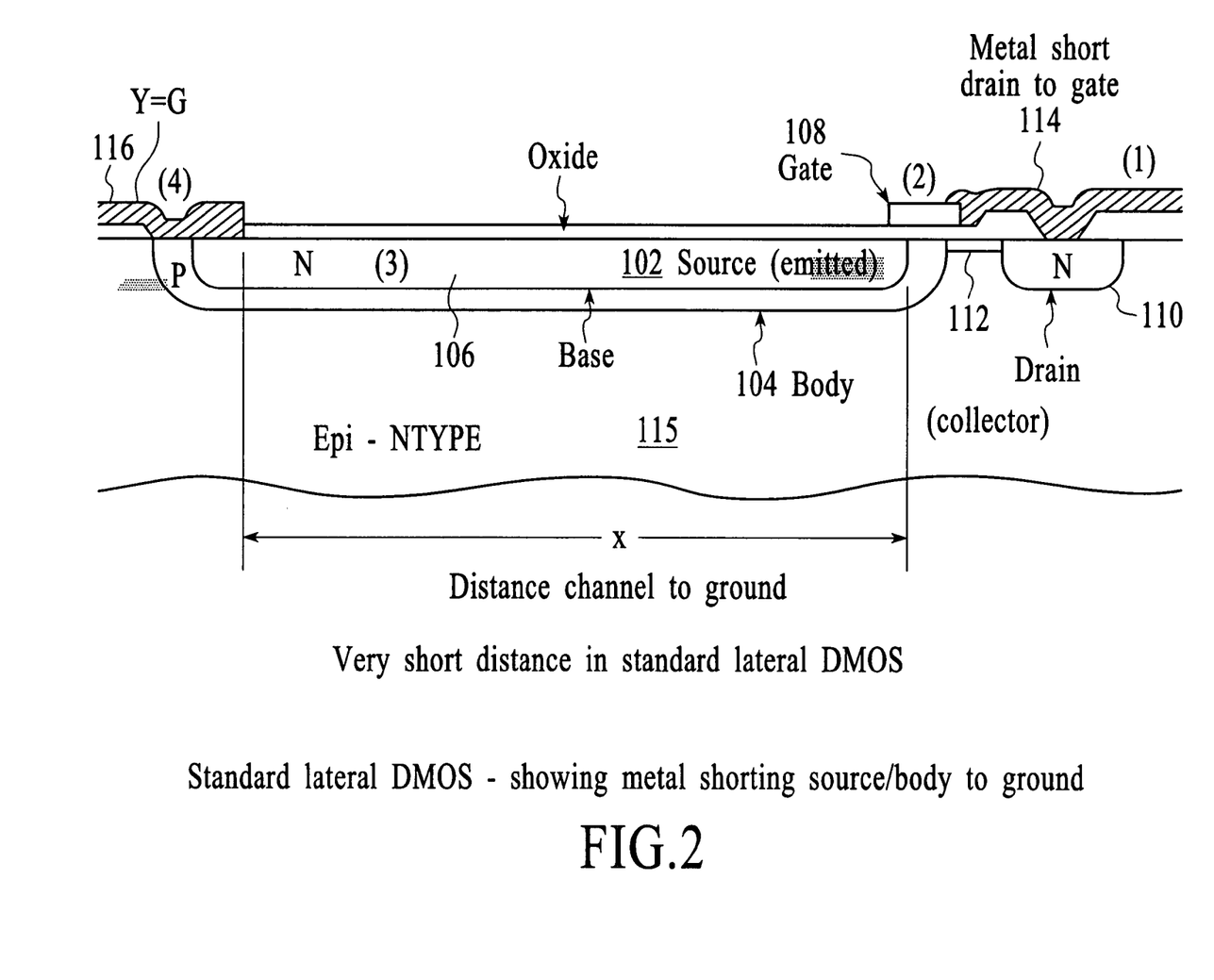
FIG. 2 shows a structure for the circuit in FIG. 1 with the active areas, including the gate, in accordance with an embodiment of the present invention.

The process for fabricating this device is described below in conjunction with the accompanying figures. First, a P-type junction is diffused into silicon (or whatever material is being used, since it is capable of working in other semiconductor materials). This process is called the body diffusion. Next, an N-type diffusion 102, also referred to as a source, is provided as shown in FIG. 2. These two diffusions would typically be formed by implanting a P-type region (also called a body or body diffusion) 104 followed by implanting an N-type region 106 in a somewhat smaller space within the P region. The two implants would then be activated, diffused, and annealed simultaneously by a cycle that is normally used in the technology in which this device is processed or by a Rapid Thermal Process (RTP). This would normally be done at a temperature of approximately 930 degrees centigrade when done in a normal high temperature diffusion furnace or a spiked temperature of approximately 1000 centigrade with an RTP cycle.

This process would leave a predetermined space between where the P and N junctions terminate at the surface. The delta between these two diffusions represents the space to be used for a gate 108 for the structure as shown in FIG. 2. Note that during the deposition of the N material, an N type drain 110 is also established as is shown in FIG. 2. This drain junction termination 110 is located, for example, one micron away from the termination of the P body diffusion leaving a drift region 112 between the body and the drain. During the course of the processing of the integrated circuit which this device is to ESD protect, a poly gate 108 would be formed on the dielectric that bridges the gap of the source/body diffusion. If this device is to be used to protect a bipolar circuit, where there is no poly for a gate structure, the gate will be formed by a metal 114 in place of the poly. FIG. 2 illustrates the structure with the active areas including the gate 108 and for this particular application the metal 114 is shown shorting the gate 108 to the drain 110.

Figure 3A:
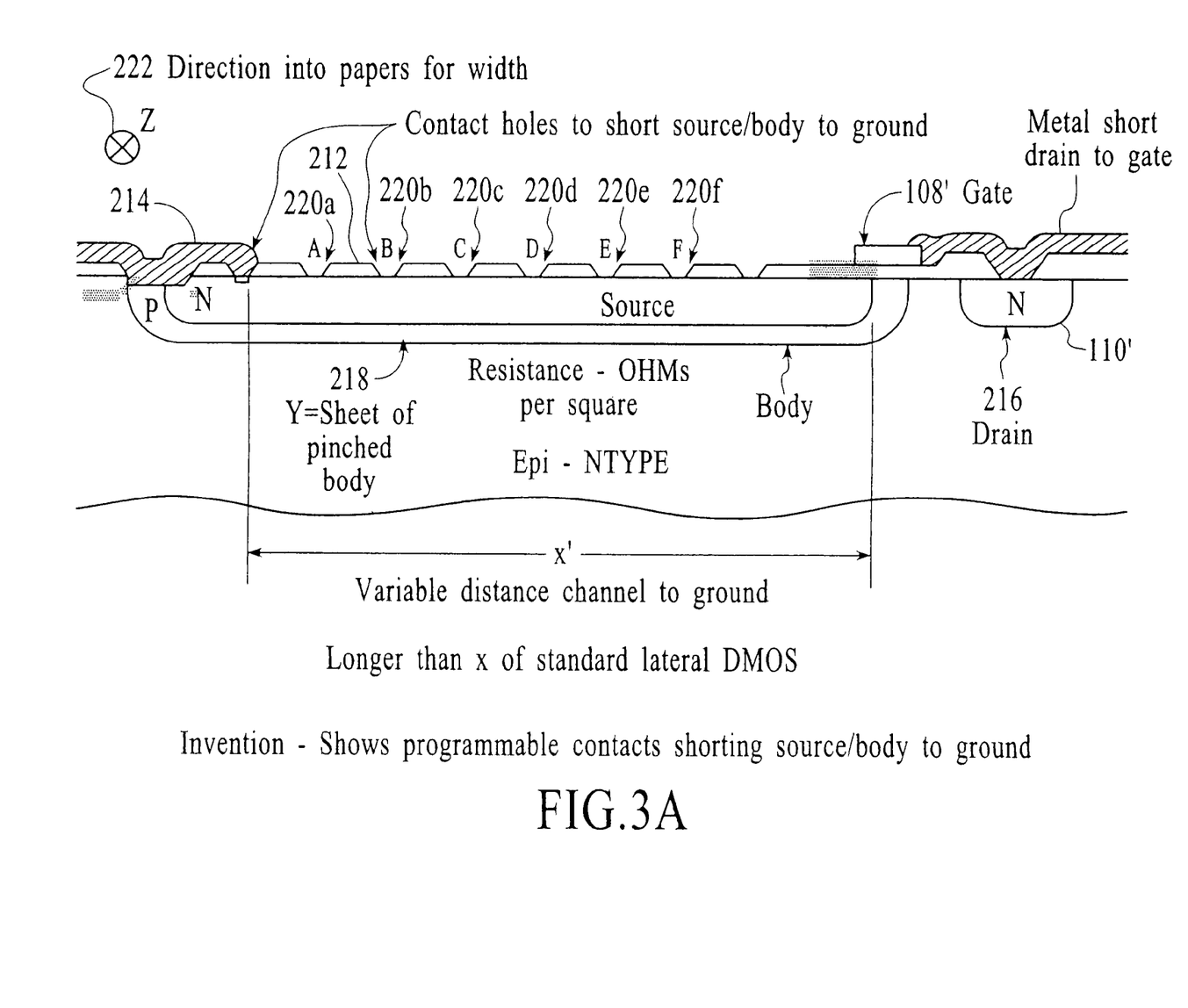
FIGS. 3A and 3B depict a plurality of contacts in an ESD protection device to short an end of the source/body diffusion to each other and to ground, thus providing programmable variable snap back voltages, according to an aspect of the present invention.
Figure 3B:
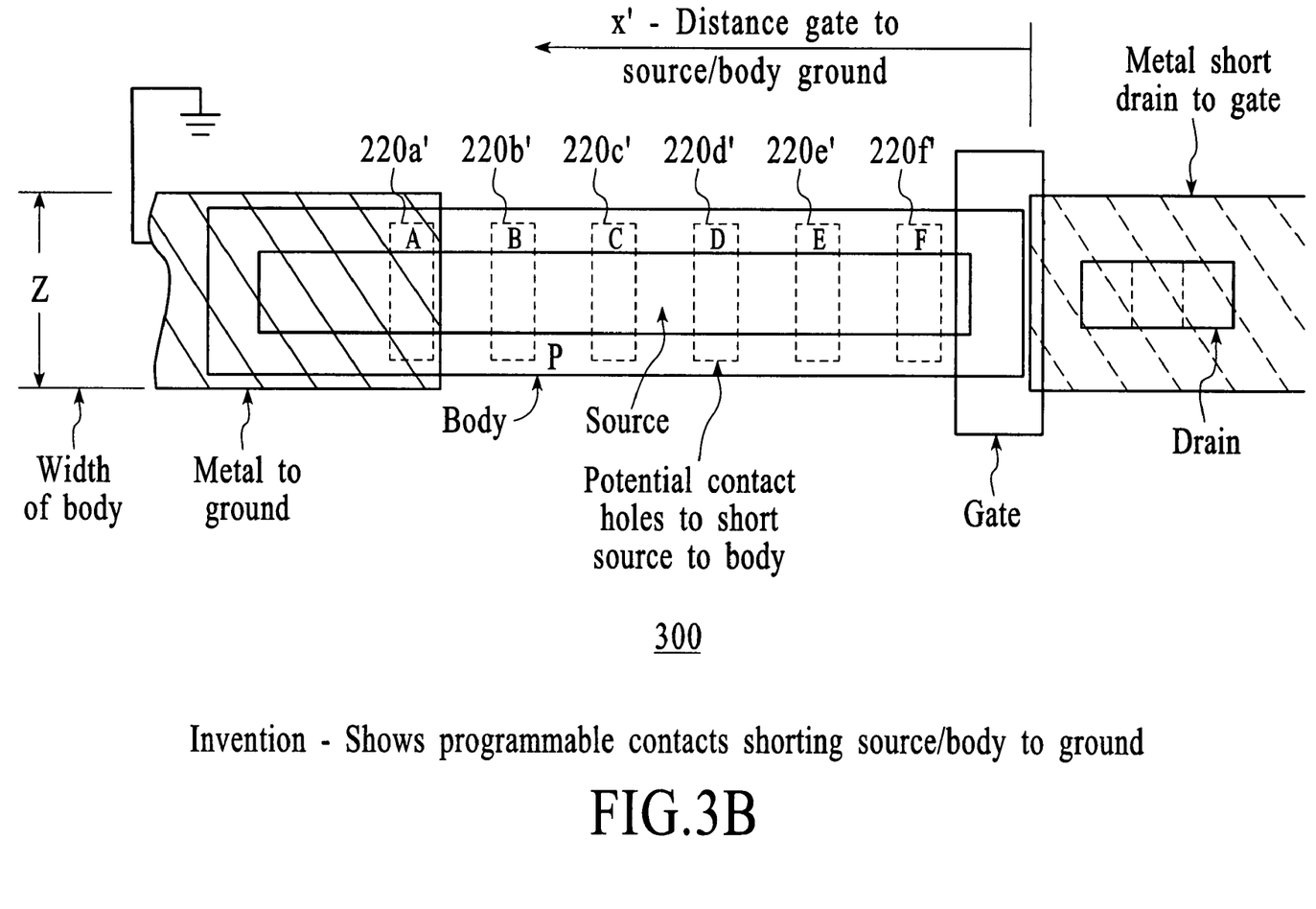

During the processing of the integrated circuit, contacts 212 will be opened and metal 214 deposited to make electrical contact to one or several of these contacts. This contacting is shown in FIG. 3A and 3B. During this step, contacts would be opened in the ESD circuit to short the end of the source/body diffusion to each other and to a ground 116 in FIG. 2 and a ground 214 in FIGS. 3A and 3B. The resulting structure is quite like a lateral DMOS. The main difference is the length of the source/body (which is longer than a normal LDMOS—approximately three times as long) and where the shorting structure occurs. This elongated structure is the reason for showing the long tail on the circuit function in FIG. 1 to properly represent it versus other similar structures. The shorting structure is made up of several contacts that could be selected rather than the one as shown in FIG. 2 with 116 shorting the ground to the source and body at the extreme end of the source/body diffusions. In FIGS. 3A and 3B, there are several contact points that could be programmed to be selected and therefore changing the length of the distance from the contact source to the channel region or the contact source through the body to the channel region; i.e., making it shorter or longer than the typical one shown in FIG. 2. It is important to understand that no extra process steps were incurred during the establishment of this structure. One may change a mask to open up a different contact or change a metal mask to perform the same operation. In an LDMOS, the structure would use the body and source/drain diffusions exactly as fabricated on the LDMOS. The same thing is true for a vertical DMOS. In a bipolar device, the body could be the base diffusion and the source could be the emitter diffusion. In a complementary metal-oxide semiconductor (CMOS) process, the body would be the P-well, and the N regions are the same as the source/drain junctions of the N portions of the CMOS. In bipolar-CMOS-DMOS (BCD) circuits, the body and source could come from any of a number of common diffusions done in the BCD technology.

At this point it is worth deviating from this structure to describe how a lateral DMOS enters into snap back (sustaining) voltage, and how a structure in accordance with various implementations of the present invention will go into snap back (sustaining) voltage.

Lateral DMOS Going into Snap Back Condition

Figure 4:
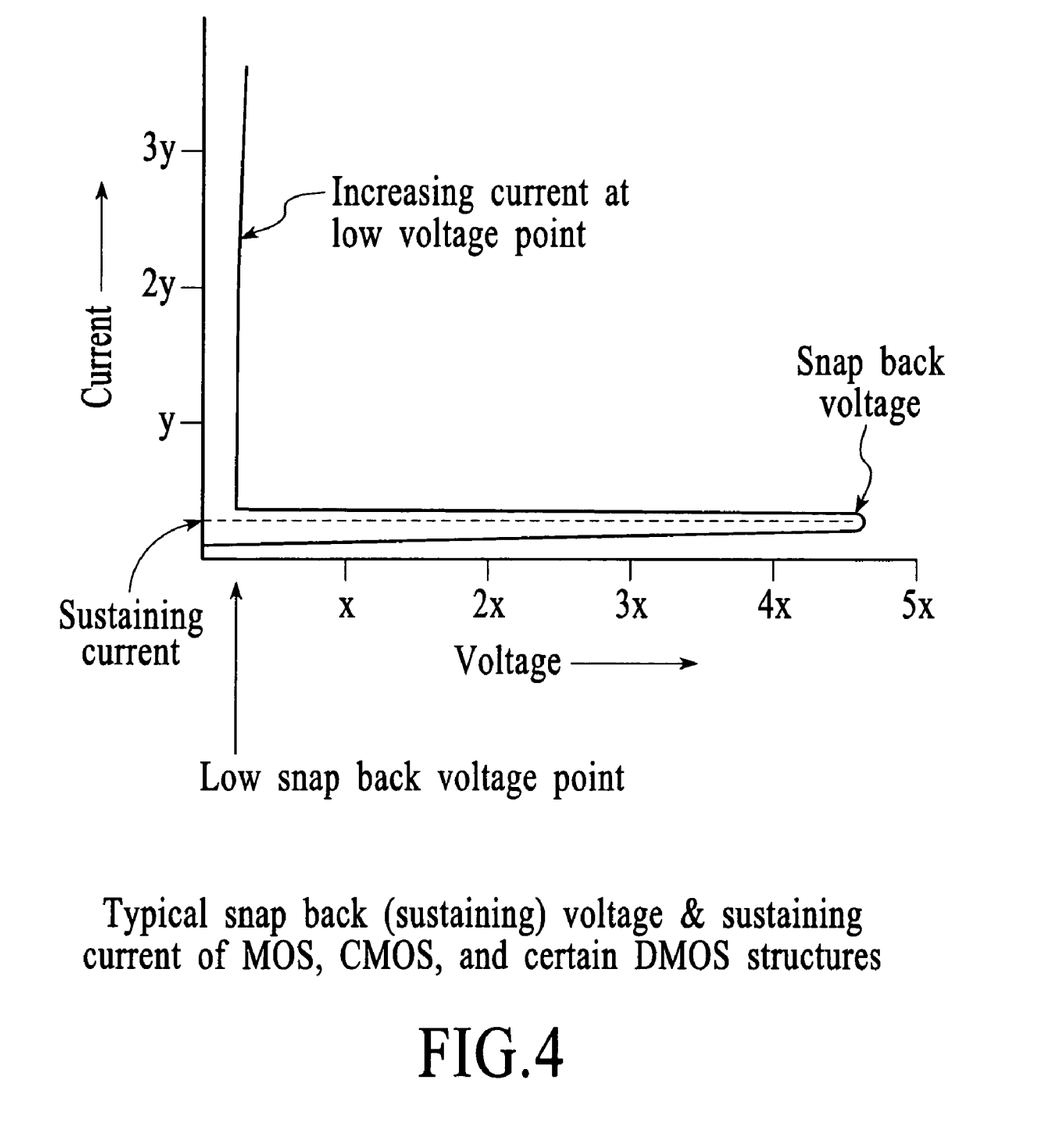
FIG. 4 illustrates a sustaining voltage "snap back" curve, which is of a type that will be provided by an ESD protection device in accordance with an implementation of the present invention.

A curve of a snap back (sustaining) voltage is shown in FIG. 4 according to an embodiment of the invention. In some respects, sustaining voltage is a misnomer. It really is a sustaining current that determines where the snap back voltage (or sustaining voltage) occurs.

FIG. 2 will now be referenced to describe the action that causes snap back (sustaining) voltage. During the normal course of using a lateral DMOS, the gate 108 is biased positively with respect to the source 102 (FIG. 1 illustrates the gate tied to the drain), causing a channel 112 to be formed from the source across the body to the drift or drain region. The drain voltage is positive and at equal or higher voltage than the gate voltage. The source 102 is grounded and the body is also grounded at the point "G" 116 shown in FIG. 2. The reason for the grounding of both the source and body is to prevent the snap back voltage (sustaining voltage) from occurring at some low voltage below the expected operating voltage of the device and circuit. As the gate voltage is increased, the current from source to drain through the channel increases. The current flow across the channel region results in an impact ionization occurring at the body/drift or body/drain junction. This results in electrons/holes being generated. The holes move into the body (pinched and therefore it has high sheet resistance denoted as "Y") region and flow toward ground. This constitutes a current flow through the pinched (high resistance) body toward ground. The current flow results in a voltage drop along the path to the ground position. This drop is due to the current flow through the high resistance of the body. In a normal operation, the end marked "G" 116 is a distance away from the gate region 118. This distance is a number of squares away from the other end of the source and these numbers of squares will be represented as "x". The body has a high sheet resistance of "Y" ohms per square in the region under the source from the gate region to the ground position. Therefore, the resistance (R) from the gate (or channel) edge to the grounded position is x*Y ohms (number of squares times the sheet resistance per square). The current flow (I) across this x*Y resistance equates to an IR drop or voltage drop of "Z" volts. Under normal operation, the distance "x" is made as short as possible to reduce the resistance and therefore the voltage drop is less than +0.6 volts from the body to source/ground and therefore, the NP (source/body) junction drop is such that the junction will not be forward biased. However, as the current is increased in the LDMOS, there is an increase in the impact ionization and the hole current in the pinched body. At some point in the operation of the LDMOS, as the gate voltage is increased, the hole current in the body due to the increased impact ionization will increase to the point where the drop across the body resistance is such that the NP (source/ground to body) junction will be forward biased. At this point there is an NPN bipolar transistor structure formed from the source 102 (emitter) to body 104 (base) to drift/drain (collector/epitaxial) region 115 (see FIG. 2) and this device suffers an LVCEO (low voltage collector-emitter-open) switch back of voltage similar to the LVCEO of a bipolar transistor and represents a very low resistance to ground. A sample curve is shown in FIG. 4. This is due to the high NPN beta of this NPN bipolar transistor amplifying any injection from the grounded source to body by the forward biased diode. In actual use, all devices are designed for this shorted source to ground region to be a short distance from the channel region, which results in a low body resistance and leads to a low voltage drop because of the current from the impact ionization flowing in the body to ground. This is normally designed, which results in the sustaining voltage occurring at a voltage higher than the operating voltage of the device, i.e., to happen at some operating point outside the normal recommended operating points, so it is transparent to the user.

Operation of the ESD Protection Circuit

FIGS. 3A and 3B illustrate the ESD protection circuit in accordance with an embodiment of the present invention. The body region has purposely been made a long distance (x') from the channel region to the physical ground point. The resistance along the body to this ground point is the product of the "x'" distance and the "Y'" sheet resistance 218 of this pinched body region. The distance depends on where the ground is made to short from the source to the body. With this presentation there are multiple contact points for the source to be grounded to the body, as shown in FIG. 3A and 3B, and thus there are several "programmable" selections for the distance "x'". This variable "x'" times "Y'" determines the resistance such that when the current flow due to impact ionization has an IR drop of 0.6 volts, it results in the occurrence of the snap back voltage condition. Since there are several metalized contact points along the source/body, as shown in FIGS. 3A and 3B, the IR drop and therefore the snap back voltage can be varied depending on which contact the metal is connected to. If the contacts are lettered 220a-220f, for example, as shown in FIGS. 3A and 3B, the snap back voltage will be lowest when connected to 220a (contact closest to ground and longest body "x'" distance from the channel) and highest when connected to 220f. This would result in a variable voltage "Zener" type function since the snap back voltage is quite similar to a Zener breakdown voltage. For example, this device could be set up such that the "220a contact" resulted in a snap back voltage of 10.0 volts and the "220f contact" results in a snap back voltage of 50 volts. The "220a" voltage and the "220f" voltage could also be set to run from 6 to 30+ volts depending on the length of the body region and the tap that it is connected and how wide the designer made the body region ("Z" in FIG. 3A and 3B), which determines one dimension of the sheet resistance. The range is up to the designer to perform across his/her many products.

For example, it may be desired to protect the inputs from any voltage from 6 volts and above. This could be similar to the "220a" tap. Therefore, the circuit shown in FIG. 1 would be free to operate as normal for any voltage below 6 volts. If an ESD spike of above 6 volts hit the input, it would immediately turn on the protection circuit so that all voltage and current generated by the ESD spike above 6 volts would go to ground via the snap back voltage. Since the way the protection circuit is hooked up with the gate, as shown in FIG. 1, 108 is tied to the drain 110, the ESD spike causes the drain 110 and the gate 108 to be elevated and the device goes into heavy conduction. In a spike of ESD energy, the initial hit is the highest energy and it dissipates during the ESD event in this protection circuit. The protection circuit described here is very efficient. At the high ESD voltages and high currents (high energy), the channel is heavily inverted and the resistance of the device is at its lowest. This will allow heavy conduction of the device and increase the impact ionization current dramatically and the flow of the holes toward ground, which results in a high drop in the body and snap back voltage to occur such that the high voltage/high energy spike is directed to ground without developing a high voltage at the input node to the active circuit (FIG. 1, point (4) input and the active input being protected).

The amount of energy that it is desired for a design can be accommodated. To handle higher levels of energy, the protection device is increased in width 222 (Z direction into the paper in FIG. 3A or the Z width shown in FIG. 3B). A circuit designer designs the protection devices for protection against various voltage levels of ESD as well as the current level (the power). This is determined by the tap that is connected on the string of taps 220a-220f on the source to body shorting. In this example, there are 6 taps but a much larger number may be implemented, or a smaller number. The resistance of the special ESD circuit is determined by the on resistance of the bipolar transistor (not shown) that turns on when the device goes into snap back (sustaining) voltage. This represents a resistance that restricts the total current level during the ESD event. When the protection circuit is in snap back, the voltage drop of the ESD spike current is below 0.6 volt to ground. This is determined by the Z width of the ESD device. As soon as the ESD event is over, the protection device turns off and returns to its normal "off" condition. This is the result of the voltage being supplied to the drain 110 and gate 108 of the ESD circuit being dissipated via the snap back to ground. This ESD protection device can be optimized by changing the tap to which the metal is connected. This can be calculated or can be determined empirically. This gives the designer some margin for error. However, once the proper tap (220a-f in this example) is determined for a given process, it is good for that given voltage and that given energy for any product using this process. New circuits being designed must protect against a given voltage that is above the operating voltage of the circuit. Once the right tap 220a-f is selected, the protection device should remain the same for all the technologies having this same operating voltage. Having once characterized the snap back voltage for the various contact positions, the designer is then able to select a different contact point for any other operating voltages so as to protect circuits for their particular operating range. This makes a very broad use device that requires no extra processing. Some circuits are more sensitive to ESD and although the configuration of the protection circuit may not change physically from one technology to another, the perfect grounding tap for each technology may differ. A test vehicle or the actual circuit may be used to empirically determine the optimum tap to short. Once determined for that process/technology, the tap point will remain unchanged.

For a different process/technology the physical size of the structure may remain exactly the same and only the proper programming tap needs to be determined for the new process/technology. However, the width of the total device may need to be increased if the device is to be operated in a particularly vile environment. This provides very wide use of the same structure at a given production location where many device types and processes are implemented.

Operation of the Protection Circuit when no ESD Spike is Present

It is important to understand how the device operates when there is no ESD spike and this device is hanging on the input of the device it is protecting. The device must not load down the circuit it is protecting. Fortunately, the threshold voltage of a lateral structure such as this is determined by the fairly heavily doped source and body diffusions. The Threshold is determined essentially at the point where the ND (doping of the source) NA (doping of the body) product crosses at their minimum point. This results in a threshold that is higher than a normal FET gate or a bipolar base emitter diode. This threshold voltage is normally between 1 and 2 volts. This being the case, the protection device is not turned on under the normal operating signals of the device it is protecting, but it only takes a little higher voltage and it is in position to turn on. This is where the ESD spike comes into play. The ESD spike represents a spike of higher voltage and power and not only turns the protection device on, but also causes it to snap back.

Advantage Over Present ESD Protection Devices

The ESD protection device in accordance with various implementations of the present invention has several advantages over other protection devices. Some of these advantages include:

1. The device is small in size for the voltage and energy to be handled.
2. The structure of the device is simple.
3. The device is available for all the technologies without additional processing.
4. The device is fast acting—on and off.
5. The device is very efficient in power dissipation.
6. Variable voltage protection is available depending on the tap selected.
7. The device is able to reach high voltages for certain protection, as well as low voltages for protection of low voltage operating circuits. This is not readily available in most ESD circuits.
8. The device is useful in bipolar circuits by using a metal gate if poly is not used in the process.
9. The device is very flexible in bipolar circuits, whereas protection circuits are normally somewhat limited in the voltage range due to the limited kinds of diffusions and related junctions
10. Resistance of the ESD circuit is an inverse function of the voltage level of the ESD event, i.e., when the ESD voltage is high, it provides a high drain and gate voltage to the device and causes the channel to take on more charge and become more conductive, thus allowing more turn on current, lower resistance, more impact ionization, more hole current, and eventually more current to flow to ground via the snap back voltage to a much lower voltage. As the ESD voltage dissipates, the opposite is true.
11. Once the tap is determined for optimum operation for a given process or technology, it will stay at that position since, no matter the technology, the objective is to protect against a given condition, i.e., 6 volts at a certain energy. The programmable contact tap allows for variable use.
12. Although described as an ESD protection device, it also can be used as a variable Zener diode internal to the circuit of use. The ability of the device to truncate voltages above a certain level makes it ideal for applying as a Zener type voltage for voltage limitation. Zener diodes or breakdown voltage diodes are limited in their voltage range and in their ability to carry high current at a given voltage. Experience with this device determines both the voltage range and the current range and these are repeatable functions by the device. It is a non-destructive voltage control and returns to normal use when voltages are lower than the node this device is protecting or controlling. Since it represents a high resistance at these lower voltages, it does not load down the circuit being controlled.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a programmable electrostatic discharge (ESD) protection device, the method comprising:
   providing a source diffusion in a substrate;
   providing a deeper body diffusion than the source diffusion at its lowest point in the substrate;
   providing a gate at a space between the source diffusion and the body diffusion; and
   providing a variable structure for shorting the source diffusion and the body diffusion to each other when ESD voltage is encountered on a circuit connected thereto, wherein the variable structure comprises a plurality of contacts over the source diffusion for the source diffusion to be grounded to the body diffusion.

2. The method of claim 1, wherein the variable structure causes the ESD protection device to operate in a snap back condition when the ESD voltage is encountered.

3. The method of claim 2, wherein a snap back voltage of the ESD protection device is varied depending on which of the plurality of contacts is used to ground the source diffusion to the body diffusion.

4. The method of claim 2, wherein the plurality of contacts allow for variable ESD voltage protection via snap back or sustaining voltage.

5. The method of claim 4, wherein the ESD protection device can be utilized in high voltage and low voltage conditions.

6. The method of claim 5, wherein resistance of the ESD protection device is an inverse function of the ESD voltage.

7. The method of claim 1, wherein the gate is a metal gate.

8. The method of claim 1, wherein the source diffusion comprises an N-type diffusion.

9. The method of claim 1, wherein the deeper body diffusion comprises a P-type diffusion.

10. A method for providing a programmable electrostatic discharge (ESD) protection device, the method comprising:
   providing a source diffusion in a substrate;
   providing a deeper body diffusion than the source diffusion at its lowest point in the substrate;
   providing a gate at a space between the source diffusion and the body diffusion; and
   providing a variable structure for shorting the source diffusion and the body diffusion to each other when ESD voltage is encountered on a circuit connected thereto, wherein the variable structure comprises a plurality of contacts at variable distances over the source diffusion for the source diffusion to be grounded to the body diffusion, wherein a snap back voltage of the ESD protection device is varied depending a distance of a selected contact, from the plurality of contacts, used to ground the source diffusion to the body diffusion.

* * * * *